United States Patent
Ohie

[19]

[11] Patent Number: 5,815,105
[45] Date of Patent: Sep. 29, 1998

[54] ANALOG-TO-DIGITAL CONVERTER WITH WRITABLE RESULT REGISTER

[75] Inventor: Mitsuya Ohie, Tokyo, Japan

[73] Assignee: Oki Electric Industry Co., Ltd., Tokyo, Japan

[21] Appl. No.: 562,118

[22] Filed: Nov. 22, 1995

[30] Foreign Application Priority Data

Nov. 25, 1994 [JP] Japan .................................. 6-291468

[51] Int. Cl.[6] .................................................. H03M 1/00
[52] U.S. Cl. ........................................ 341/155; 341/126
[58] Field of Search .................................. 341/120, 126, 341/155

[56] References Cited

U.S. PATENT DOCUMENTS

| | | | |
|---|---|---|---|
| 5,047,770 | 9/1991 | Engeler et al. | 341/120 |
| 5,175,547 | 12/1992 | Lyon et al. | 341/120 |
| 5,185,607 | 2/1993 | Lyon et al. | 341/120 |
| 5,212,483 | 5/1993 | Wakimoto | 341/141 |
| 5,225,834 | 7/1993 | Imai et al. | 341/120 |
| 5,293,167 | 3/1994 | Campbell, Jr. et al. | 341/141 |
| 5,305,003 | 4/1994 | Han | 341/120 |

OTHER PUBLICATIONS

Geiger et al., VLSI Design Techniques for Analog and Digital Circuits, McGraw–Hill, pp. 651 to 652.
Automotive Products Handbook, Intel, Jan. 1994, pp. 8–166 to 8–167.

*Primary Examiner*—Jeffrey A. Gaffin
*Assistant Examiner*—Peguy JeanPierre

[57] ABSTRACT

An analog-to-digital converter has a conversion section that converts an external analog signal to an internal digital signal, a digital input port that receives an external digital signal, and a result register. A selector controlled by a selection signal selects either the internal digital signal or the external digital signal for storage in the result register. The external digital signal can be written into the result register for test purposes, or to use the result register for general-purpose data storage.

10 Claims, 4 Drawing Sheets

ANALOG-TO-DIGITAL CONVERTER WITH WRITABLE RESULT REGISTER

BACKGROUND OF THE INVENTION

The present invention relates to an analog-to-digital converter, more particularly to the register access capabilities of an analog-to-digital converter.

Analog-to-digital converters, commonly referred to as ADCs, are used to digitize continuously varying voltages or other analog quantities in a wide variety of electronic devices. A conventional ADC includes a read-only register, referred to hereinafter as a result register, for storing the digitized data. After each conversion, the ADC automatically loads the conversion result into the result register, from which the result can be read by an external device.

A disadvantage of the conventional ADC is that because the result register is a read-only register, it is extremely hard to test. The only way to test the result register is to supply the ADC with various known analog inputs, have the ADC convert each analog input, and check that the correct result can be read from the result register. Besides requiring an analog signal generator, this test procedure can take considerable time, because in most types of ADCs the conversion process itself takes time.

This test procedure also lacks accuracy, because of the difficulty of generating precise analog signals. The least significant bit of the result register is especially hard to test for this reason. To make matters worse, zero- or full-scale error in the ADC may prevent certain desired test data, such as data with all zero-valued bits or all one-valued bits, from being generated at all.

Because of these difficulties, ADCs are commonly tested under the assumption that the result register is operating normally. This assumption is not always true: wafer defects, photolithography defects, or ambient dust particles in the fabrication process may lead to such transistor faults as current leakage, failure to turn on or off correctly, failure to operate at high temperatures, failure to operate at high frequencies, or failure to operate at certain voltage levels. In the result register, such faults can produce incorrect read data. Bits may invert for no apparent reason, or may become stuck in the one state or zero state.

When the result register of a conventional ADC fails in this way, it becomes difficult to tell what is happening inside the ADC, hence difficult to analyze the fault. It may be impossible to determine, for example, whether the fault is in the result register, or in the conversion circuit itself. Moreover, if the fault occurs only under certain temperature, voltage, or frequency conditions, the fault may go undetected for some time. In safety-critical equipment, such as automotive electronic systems, such undetected faults can have serious consequences.

ADCs with multiple input channels and multiple result registers are frequently built into large-scale integrated circuits such as microcontrollers. Often the analog input channels of an ADC in a microcontroller are programmable, meaning that unused analog input terminals can be assigned to other functions. Unused read-only result registers, however, cannot be reassigned in this way, for they receive data only from the conversion section of the ADC. This creates another problem: waste of the microcontroller's internal register resources when not all analog input channels are used.

SUMMARY OF THE INVENTION

It is accordingly an object of the present invention to facilitate the testing of an analog-to-digital converter.

Another object of the invention is to facilitate self-testing of an analog-to-digital converter in a microcontroller.

Still another object of the invention is to permit unused result registers of an analog-to-digital converter in a microcontroller to be assigned to other functions.

The invented analog-to-digital converter has an analog input port for receiving an external analog signal, a digital input port for receiving an external digital signal, and a control port for receiving a selection signal. A conversion circuit in the analog-to-digital converter converts the external analog signal to an internal digital signal. A selector selects either the internal digital signal or the external digital signal, responsive to the selection signal. The selected digital signal is stored in a result register, and can be read at a digital output port.

DETAILED DESCRIPTION OF THE INVENTION

Three embodiments of the invention will be described with reference to the attached illustrative drawings.

Figure 1:
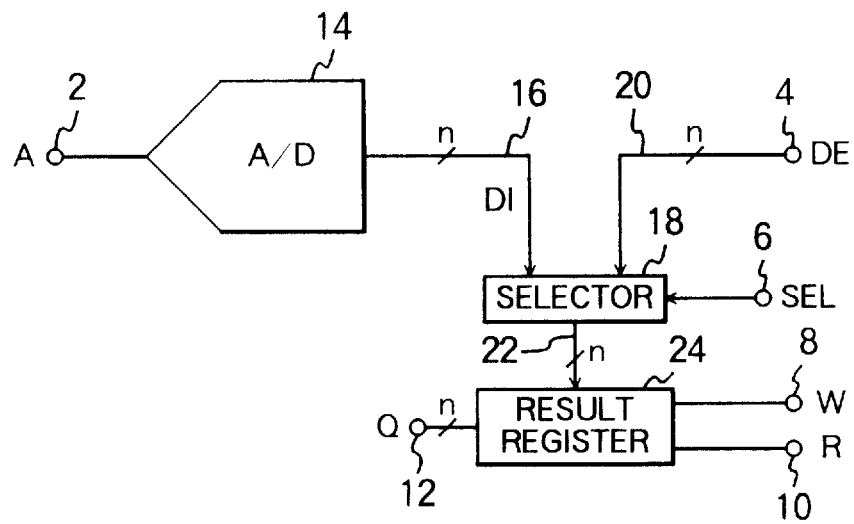
FIG. 1 is a block diagram of a first embodiment of the invented analog-to-digital converter of the present invention.

Referring to FIG. 1, the first embodiment of the analog-to-digital converter of the present invention includes a single analog input port 2 for receiving an external analog signal A, a digital input port 4 for receiving an external digital signal DE, control ports 6, 8, and 10 for receiving a selection signal SEL, a write control signal W, and a read control signal R, and a digital output port 12 for a digital output signal Q. Digital signals DE and Q have a data width of n bits, where n is a positive integer, so ports 4 and 12 may be parallel data ports accommodating n signal lines each.

An analog-to-digital conversion section 14 converts the analog input signal A to an n-bit internal digital signal DI, which is output on an n-bit internal data path 16 to a selector 18. The selector 18 also receives the external data signal DE from input port 4, via another n-bit internal data path 20, and receives the selection signal SEL from input port 6. The selector 18 selects DE or DI and sends the selected signal on yet another n-bit internal data path 22 to a result register 24.

The result register 24 stores the selected signal, DE or DI, in response to input of the write signal W, and outputs the stored signal to output port 12 in response to input of the read signal R.

The read and select signals R and SEL are generated externally with respect to the analog-to-digital converter. The write signal W can be generated externally, and can also be generated within the analog-to-digital converter, by control circuitry not shown in the drawings.

Figure 2:
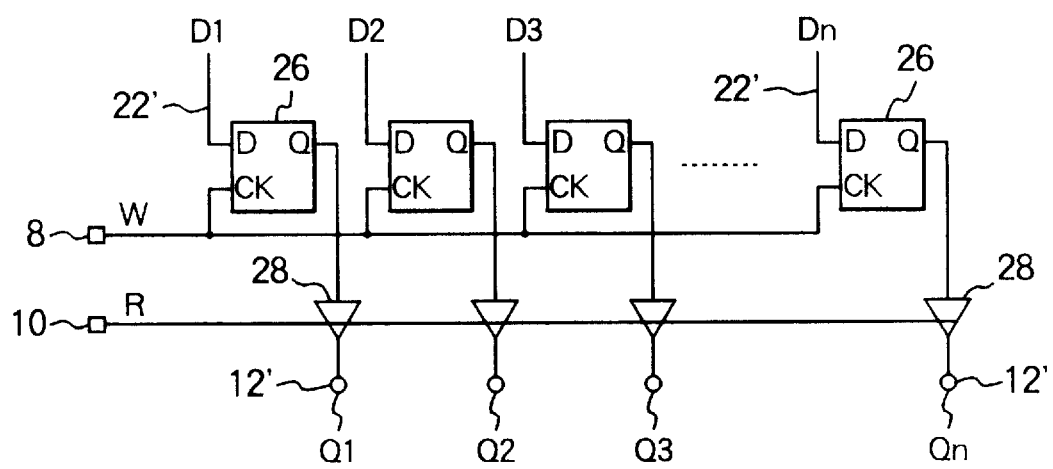
FIG. 2 is a circuit diagram of the result register shown in FIG. 1.

FIG. 2 shows the circuit configuration of the result register 24. This register 24 has n delay flip-flops 26, each with a data input terminal D, data output terminal Q, and clock input terminal CK. The data input terminals D receive the n bits D1, . . . , Dn of the selected digital signal via the n signal lines 22' of data path 22. The clock input terminal CK receives the write signal W from input port 8. The data output terminals Q are coupled to n buffer amplifiers 28, which are controlled by the read signal R from port 10. The amplifiers 28 output the n bits Q1, . . . , Qn of the digital output signal Q at the n-bit output port 12, which comprises 12 individual output terminals 12'.

Figure 3:
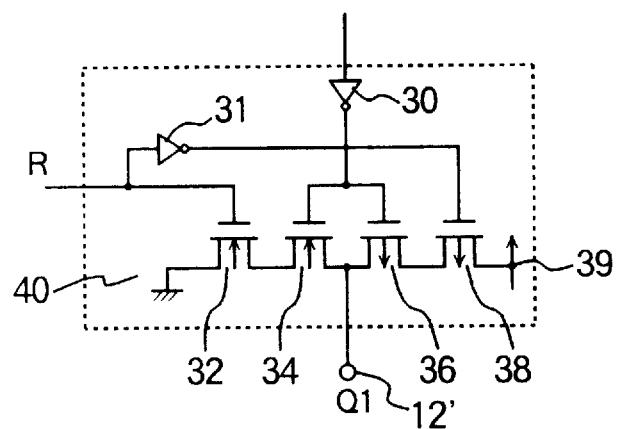
FIG. 3 is a circuit diagram of the buffer shown in FIG. 2.

FIG. 3 shows the circuit configuration of the buffer amplifiers 28 in FIG. 2. The first buffer amplifier 28 is shown as an example, but all n buffer amplifiers 28 have the same type of structure.

Each buffer amplifier 28 comprises a pair of inverters 30 and 31, and four field-effect transistors 32, 34, 36, and 38 coupled in series between a power-supply terminal 39 and a ground terminal 40. The two transistors 32 and 34 on the ground side are n-channel metal-oxide-semiconductor (NMOS) field-effect transistors; the two transistors 36 and 38 on the power-supply side are p-channel metal-oxide-semiconductor (PMOS) field-effect transistors. Inverter 30 receives the data output signal from, for example, the first flip-flop 26 in FIG. 2, and controls the gates of transistors 34 and 36. Inverter 31 receives the read signal R and controls the gates of transistors 32 and 38.

Figure 4:
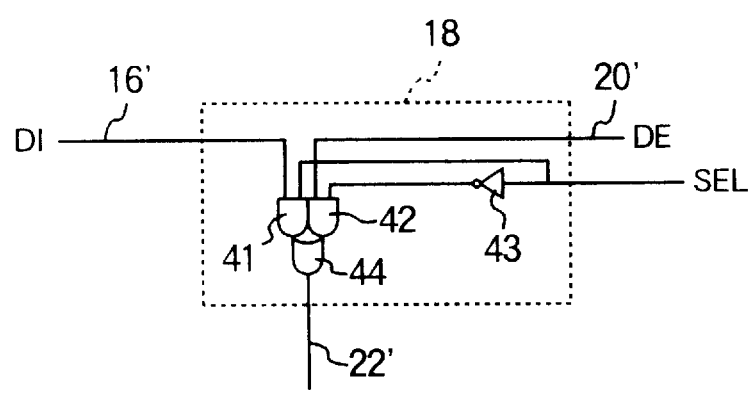
FIG. 4 is a circuit diagram of the selector shown in FIG. 1.

FIG. 4 shows the circuit configuration of a one-bit section of the selector 18. The selector 18 comprises n parallel sections with this structure. All sections of the selector 18 receive the selection signal SEL. Signal lines 16', 20', and 22' in FIG. 4 are bit lines in the corresponding data paths 16, 20, and 22 in FIG. 1.

The circuit in FIG. 4 has a pair of two-input AND gates 41 and 42, an inverter 43, and a two-input OR gate 44. AND gate 41 receives the selection signal SEL, and receives one bit of the internal digital signal DI on signal line 16'. AND gate 42 receives the selection signal SEL as inverted by inverter 43, and receives one bit of the external digital signal DE on signal line 20'. OR gate 44 receives the outputs of AND gates 41 and 42, takes their logical OR, and sends the result to the result register on signal line 22'.

Next, the operation of converting analog input A to digital output Q will be described. During this operation the selection signal SEL is driven high, enabling AND gate 41 in FIG. 4 and disabling AND gate 42, so that selector 18 selects the internal digital signal DI. The read and write signals R and W are both initially inactive.

The conversion circuit 14 in FIG. 1 samples the voltage of analog input signal A, quantizes the sampled voltage, and outputs an internal data signal DI representing the quantized value. Various methods of conversion from A to DI can be used, such as the well-known method of successive approximations. The invention is not restricted to any particular conversion method.

When conversion is complete and the correct internal digital signal DI is present on data paths 16 and 22, the write signal W is activated briefly. This write pulse causes the flip-flops 26 in FIG. 2 to latch the internal digital signal DI from data path 22 and begin output of the DI data at their output terminals Q.

To read the conversion result, an external device such as a central processing unit (CPU, not visible) activates the read signal R by driving R high, causing transistors 32 and 38 in FIG. 3 to turn on. Depending on the value of the data signal inverted by inverter 30 in FIG. 3, one of the two transistors 34 and 36 turns on, causing output of a high or low bit at output terminal 12'. Thus the conversion result, stored as an internal digital signal DI in the result register 24, is output as a digital output signal Q at output port 12.

Next the operation of testing the result register 24 will be described. During this operation the selection signal SEL is low, disabling AND gate 41 in FIG. 4 and enabling AND gate 42, so that selector 18 selects the external digital signal DE.

The test is carried out by writing various data patterns in the result register 24 and checking whether they can be read correctly. If the data width is eight bits (n=8), for example, the data patterns '0000 0000,' '0101 0101,' '1010 1010,' and '1111 1111' can be tested. These patterns check that a zero and a one can be written in each bit, and check for interference such as a short circuit between adjacent bit lines.

The data pattern to be tested is sent to digital input port 4. Since the selection signal SEL is low, selector 18 selects this data pattern and sends it to the result register 24. The write signal W is then activated at an appropriate time, storing the data pattern in the result register 24 as explained above. After the write signal W has been deactivated and a certain time has elapsed, the read signal R is activated and the result register contents are read from the digital output port 12. The test passes if the read data match the written data for all patterns tested, showing that data can be written, held in the result register for a certain time, then read correctly.

This test can be executed quickly and easily, because the desired test patterns are written directly from the digital input port 4, instead of being generated by converting equivalent analog voltages.

If the result register 24 passes this test, the conversion section 14 can then be tested by supplying known analog input signals A and checking whether they are converted to correct output data Q. If the output data Q are not correct, it will be clear that this is due to a conversion error and not a result-register malfunction. This knowledge simplifies fault analysis and the planning of remedial action.

Next, a procedure for checking the analog-to-digital converter during operation will be described. This procedure is useful when a slowly-changing analog signal, such as a signal from a temperature sensor, is converted at regular intervals.

In this situation, if the same output data Q are obtained repeatedly, that might indicate that the analog input signal is not changing, or it might indicate that the result has become stuck at one value due to an electrical fault. Therefore, each time the output data Q are read, the value of Q is altered, e.g. by subtracting a fixed quantity, to create test data DX, which are sent to the digital input terminal 4. The selection signal SEL is driven Low and the write signal W is briefly activated, writing the altered data DX into the result register 24. The selection signal SEL is driven high again before the next conversion ends.

When the next conversion ends and the output data Q are stored and read again, if the result is equal to DX, that raises the suspicion of a malfunction. If this happens repeatedly, the suspicion becomes a substantial certainty. Appropriate action can then be taken, such as displaying an alarm indication, halting a potentially dangerous operation, or switching over to a fail-safe mode.

This checking procedure is particularly useful when the analog-to-digital converter is built into a device such as a microcontroller that can be programmed to carry the check out automatically. In a microcontroller that controls an automobile, for example, it is highly desirable to have analog conversion results checked in this way. The microcontroller can be programmed to carry out a more thorough check by reading the DX value before the next conversion begins, to verify that DX was actually written in the result register 24.

Figure 5:
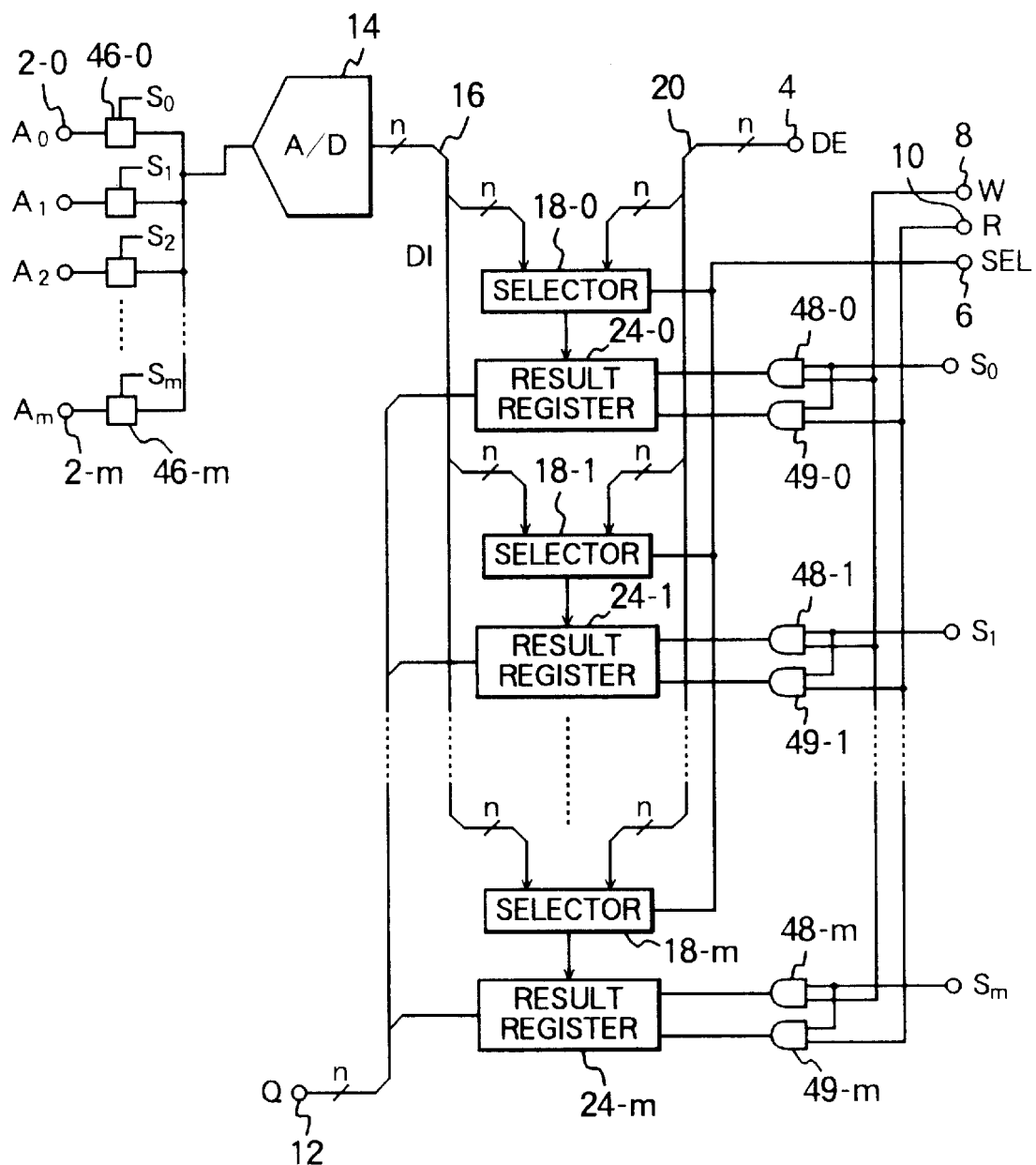
FIG. 5 is a block diagram of a second embodiment of the analog-to-digital converter of the present invention.

Referring to FIG. 5, the second embodiment is an analog-to-digital converter with multiple analog input ports or channels. The same reference numerals are used as in FIG. 1 to identify identical or similar elements, using hyphenated suffixes to indicate multiple elements of the same type. For example, the analog input ports are numbered 2-0 to 2-m (m being a positive integer).

The analog ports 2-0 to 2-m are connected to respective analog switches 46-0 to 46-m, which are controlled by channel address signals $S_0$ to $S_m$. Analog switches 46-0 to 46-m are coupled in parallel to the conversion section 14.

Data paths 16 and 20 are coupled in parallel to m selectors 18-0 to 18-m, all of which receive the same selection signal SEL from control port 6. The signals selected by the selectors are provided to respective result register 24-0 to 24-m, which are coupled in parallel to the digital output port 12.

Result registers 24-0 to 24-m receive the write signal W from control port 8 through respective two-input AND gates 48-0 to 48-m, and receive the read signal R from control port 10 through respective two-input AND gates 49-0 to 49-m. The second inputs to these AND gates are the channel address signals $S_0$ to $S_m$.

The analog-to-digital conversion operation will be described next, taking conversion of analog signal $A_0$ as an example.

To convert this signal, channel address signal $S_0$ is driven high, turning on analog switch 46-0, and channel address signals $S_1$ to $S_m$ are driven low, turning off analog switches 46-1 to 46-m. The selection signal SEL is driven high, so that all selectors 18-0 to 18-m select the internal digital signal DI.

The analog-to-digital conversion section 14 receives analog signal $A_0$ through analog switch 46-0, samples this signal, and outputs a corresponding internal digital signal DI on data path 16. After conversion has been is completed, the write signal W is driven high for a brief pulse, as in the first embodiment.

Since channel address signal $S_0$ is high, this write pulse W passes through AND gate 48-0 to result register 24-0, causing result register 24-0 to store the internal digital signal DI. Since the other channel address signals are low, the outputs of AND gates 48-1 to 48-m remain low, and the internal digital signal DI is not stored in result registers 24-1 to 24-m, which continue to hold their previous contents.

When the conversion result is read, the read signal R is driven high. The output of AND gate 49-0 then goes high, while the outputs of AND gates 49-1 to 49-m remain low. The digital signal value stored in result register 24-0 is accordingly output at the digital output port 12.

It is not necessary for each conversion result to be read immediately. It is possible, for example, first to convert all of the analog input signals $A_0$ to $A_m$, by driving the channel address signals $S_0$ to $S_m$ high in turn and pulsing the write signal W, then to read the conversion results at convenient times, by activating the read signal R and driving the channel address signals $S_0$ to $S_m$ high again. It is also possible to read the conversion result of one input channel while another channel is being converted.

Next various register tests will be briefly described.

To test a particular register, it suffices to drive the corresponding channel address signal high and proceed as in the first embodiment.

Interference between registers can be detected by writing a sequence of m different test patterns in the m result registers 24-0 to 24-m, then reading the result registers in turn.

Another type of test can be carried out by writing the same test pattern in all the result registers. The writing can be done simultaneously, if means are provided for driving all of the channel address signals high at once.

As in the first embodiment, the ability to write directly to the result registers facilitates all types of tests.

Figure 6:
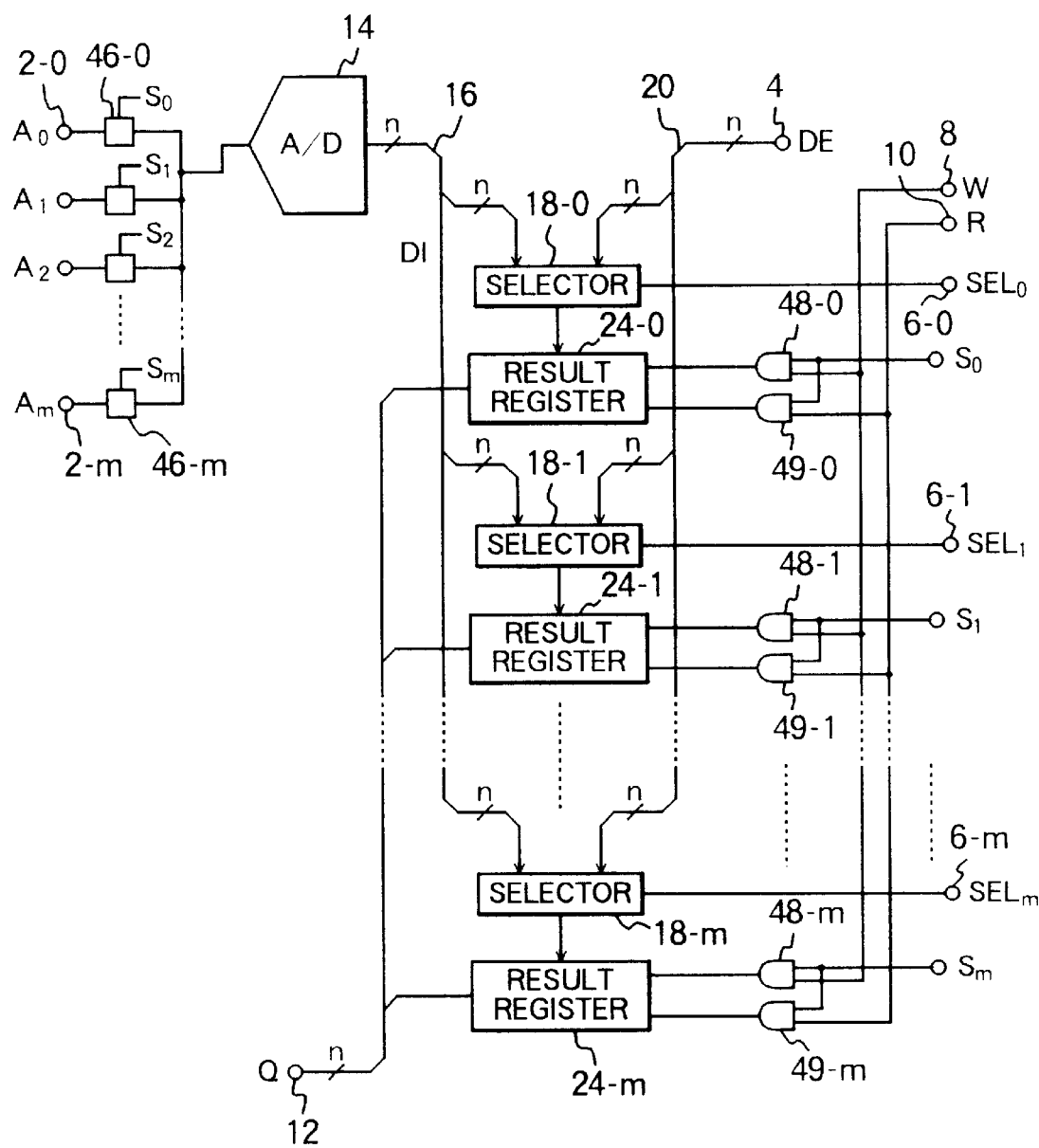
FIG. 6 is a block diagram of a third embodiment of the analog-to-digital converter of the present invention.

Referring to FIG. 6, the third embodiment is identical to the second embodiment, except that independent selection signals $SEL_0$ to $SEL_m$ from different control ports 6-0 to 6-m are supplied to the selectors 18-0 to 18-m. A detailed description of the circuit configuration and operation will be omitted. Except for the control ports, the reference numerals are the same as in FIG. 5.

Selection signals $SEL_0$ to $SEL_m$ can be generated from, for example, an m-bit control register (not visible), each register bit controlling one of the selection signals. An arbitrary set of selection signals can thus be activated. Tests can be carried out by writing to this control register and issuing the appropriate read, write, and channel address signals.

Alternatively, a decoder can be provided that decodes a value i, ranging from 0 to m, and activates signals $SEL_0$ to $SEL_i$, or decodes a pair of values (j, k) and activates signals $SEL_j$ to $SEL_k$. This arrangement provides less flexibility, but requires fewer control bits.

The third embodiment is particularly suited for use in a microcontroller. Input terminal 4 and output terminal 12 are linked to the microcontroller's internal data bus (not visible), so that the microcontroller's central processing unit (also not visible) can both read and write to the result registers. If it is not necessary to use all of the analog input channels in a certain application, the microcontroller can be programmed to set the selection signals $SEL_i$ of the unused channels permanently to the level that selects the external digital signal DE. The result registers of these channels can then be employed as general-purpose data registers. Frequently-accessed flag data or other data can be stored in these registers for rapid access. Additional logic circuitry, not shown in the diagrams, can be provided to prevent collision between read and write signals at the same result register.

The invention thus permits the microcontroller to make more complete use of its register resources than in the prior art. Unused analog input ports can of course also be reassigned, to general-purpose input or output of digital signals, for example, as in conventional microcontrollers.

The present invention is not limited to the preceding embodiments, but permits various modifications. In the second and third embodiments, for example, the number of result registers was equal to the number of analog input ports, but this need not be true in general. Two or more analog input ports can share a single result register, or a single analog input port may have multiple result registers.

In a microcontroller, some analog input ports may have fixed assignments while others are reassignable. Selectors are still preferably provided for all result registers, to facilitate testing.

The circuit configurations shown in FIGS. 2, 3, and 4 can be modified in various obvious ways. Signals that were described as active high may be active low instead.

Applications are not limited to ADCs that convert analog voltage inputs to equivalent digital values. The invention can be practiced in any device that converts any type of analog input signal to a digital output signal, including analog comparators, frequency counters, and various types of digital measuring or metering equipment.

What is claimed is:

1. An analog-to-digital converter circuit, comprising:

an analog input port for receiving an external analog signal;

a digital input port for receiving an external digital signal having a plurality of parallel bits;

a first control port for receiving a first selection signal;

a second control port for receiving a second selection signal;

a conversion circuit coupled to said analog input port, for converting said external analog signal to an internal digital signal having a plurality of parallel bits;

a first selector coupled to said conversion circuit and said digital input port, said first selector receiving said external digital signal and said internal digital signal in parallel form, said first selector selecting one signal from said internal digital signal and said external digital signal in response to said first selection signal;

a second selector coupled to said conversion circuit and said digital input port, said second selector receiving said external digital signal and said internal digital signal in parallel form, said second selector selecting one signal from said internal digital signal and said external digital signal in response to said second selection signal;

first result register coupled to said first selector for storing the signal selected by said first selector;

a second result register coupled to said second selector for storing the signal selected by said second selector; and a digital output port for parallel output of the signal stored in said first result register and the signal stored in said second result register.

2. The analog-to-digital converter circuit of claim 1, further comprising a plurality of analog input ports coupled to said conversion section in parallel.

3. The analog-to-digital converter of claim 1, wherein said analog-to-digital converter forms one part of a microcontroller.

4. The analog-to-digital converter circuit of claim 3, wherein said microcontroller includes a central processing unit which reads and writes data in said result register.

5. An analog-to-digital converter circuit, comprising:

an analog input port for receiving an external analog signal;

a conversion circuit coupled to said analog input port, for converting said external analog signal to an internal digital signal;

a digital input port for receiving an external digital signal which is independent of the internal digital signal;

a first control port for receiving a first selection signal;

a second control port for receiving a second selection signal;

a first selector coupled to said conversion circuit and said digital input port, said first selector being responsive to said first selection signal for selecting one signal from said internal digital signal and said external digital signal;

a second selector canded to said conversion circuit and said digital input port, said second selector being responsive to said second selection signal for selecting one signal from said internal digital signal and said external digital signal;

a first result register coupled to said first selector, for storing the signal selected by said first selector;

a second result register coupled to said second selector, for storing the signal selected by said second selector; and a digital output port for output of the signal stored in said first result register and the signal stored in said second result register.

6. The analog-to-digital converter circuit of claim 5, further comprising a plurality of analog input ports coupled in parallel to said conversion circuit.

7. An analog-to-digital converter circuit, comprising:

an analog input port for receiving an external analog signal;

a conversion circuit coupled to said analog input port, for converting said external analog signal to an internal digital signal;

a digital input port for receiving an external digital signal which is independent of the internal digital signal;

a first control port receiving a first selection signal;

a first selector directly connected to said conversion circuit and said digital input port, said first selector being responsive to said first selection signal, for selecting one of said internal digital signal and said external digital signal;

a second selector directly connected to said conversion circuit and said digital input port, said second selector being responsive to said second selection signal, for selecting one of said internal digital signal and said external digital signal;

a first result register directly connected to said first selector, for storing the signal selected by said first selector;

a second result register directly connected to said second selector, for storing the signal selected by said second selector; and a digital output port for output of the signal stored in said first result register and the signal stored in said second result register.

8. The analog-to-digital converter circuit of claim 7, further comprising a plurality of analog input ports coupled in parallel to said conversion circuit.

9. The analog-to-digital converter circuit of claim 7, wherein said analog-to-digital converter forms one part of a microcontroller.

10. The analog-to-digital converter circuit of claim 9, wherein said microcontroller comprises a central processing unit that reads and writes data in said first result register and said second result register.

* * * * *

UNITED STATES PATENT AND TRADEMARK OFFICE
CERTIFICATE OF CORRECTION

PATENT NO. : 5,815,105
DATED : September 29, 1998
INVENTOR(S) : OHIE, Mitsuya

It is certified that error appears in the above-identified patent and that said Letters Patent is hereby corrected as shown below:

On the Title page (Column 2),

Above "OTHER PUBLICATIONS" insert:

--FOREIGN PATENT DOCUMENTS
EP 0,341,616 A    11/1989    EPO--.

Under "OTHER PUBLICATIONS" insert:
--LYON, J.A. et al: "Testability Features of the 68HC16Z1", Proceedings of the International Test Conference, Nashville, October 28-30, 1991, 1 January 1991, Institute of Electrical and Electronics Engineers, pages 122-130.

PATENT ABSTRACTS OF JAPAN, Vol. 018, No. 486 (E-1604), 9 September 1994 & JP 06-164391 A, 10 June, 1994, Derwent Publications Ltd., London, GB.--.

Column 8, beneath line 28 (the line which begins with "a first control") insert:

--a second control port receiving a second selection signal--.

Signed and Sealed this

Tenth Day of August, 1999

Attest:

Q. TODD DICKINSON

*Attesting Officer*          *Acting Commissioner of Patents and Trademarks*